United States Patent

Taylor et al.

Patent Number: 5,834,958
Date of Patent: Nov. 10, 1998

[54] POWER ON SYSTEM

[75] Inventors: Mark A. Taylor, Cupertino; Samson K. Toy, Sunnyvale, both of Calif.

[73] Assignee: Tandem Computers Incorporated, Cupertino, Calif.

[21] Appl. No.: 86,955

[22] Filed: Jul. 2, 1993

[51] Int. Cl.⁶ .................................................. H03K 17/22
[52] U.S. Cl. ........................................... 327/143; 327/198
[58] Field of Search ............................ 307/272.3, 296.4, 307/296.5; 327/142, 143, 198

[56] References Cited

U.S. PATENT DOCUMENTS

| | | | |
|---|---|---|---|
| 4,208,594 | 6/1980 | Guicheteau | 307/296.4 |
| 4,428,020 | 1/1984 | Blanchard, Jr. | 361/90 |
| 4,433,390 | 2/1984 | Carp et al. | 307/272.3 |
| 4,493,000 | 1/1985 | Edwards | 307/296.4 |
| 4,536,667 | 8/1985 | Masuda | 307/296.4 |
| 4,572,966 | 2/1986 | Hepworth | 307/272.3 |
| 4,599,672 | 7/1986 | Planer et al. | 307/296.4 |

FOREIGN PATENT DOCUMENTS

| | | | |
|---|---|---|---|
| 0 126 242 | 11/1984 | European Pat. Off. | G01R 19/165 |
| 0 182 971 | 6/1986 | European Pat. Off. | G01R 19/165 |
| 58-0063231 | 4/1983 | Japan | 307/272.3 |
| 58-0133035 | 8/1983 | Japan | 307/272.3 |
| 59-0058917 | 4/1984 | Japan | 307/272.3 |
| 62-0094016 | 4/1987 | Japan | 307/272.3 |
| 0053625 | 3/1989 | Japan | 307/272.3 |
| 403284122 | 12/1991 | Japan | 307/272.3 |

OTHER PUBLICATIONS

European Search Report dated Oct. 27, 1994.

Toute L'Electronique No. 506, Sep. 1985, Paris, Fr pp. 112–113 Texas Instruments 'Superviseurs D'Alimentation' the whole document.

*Primary Examiner*—Tuan T. Lam
*Attorney, Agent, or Firm*—Townsend and Townsend and Crew LLP

[57] ABSTRACT

A supply voltage monitor for providing an indication of a supply voltage level considered safe for electronic circuit operation includes a supervisory or guard circuit that blocks the output of the monitor in favor of a secondary output for those periods of time when the monitor is considered to not be able of providing a valid reflection of supply voltage status.

21 Claims, 1 Drawing Sheet

POWER ON SYSTEM

BACKGROUND OF THE INVENTION

The present invention relates generally to circuits for monitoring a supply voltage to provide an indication of that the monitored voltage has reached a certain minimum value sufficient for operation of other electronic circuitry, or that the supply voltage has not dipped below that minimum. More particularly, the invention relates to an improved "power on" circuit capable of providing a valid indication of the state of a supply voltage during the initial stages of supply voltage application.

Power on (PON) circuits are commonly used to provide an indication that a supply voltage is at or exceeds a certain minimum specified value. The indication allows electronic circuitry operating from the supply voltage to be held in an off (non-operating) condition until the supply voltage has reached a voltage level that ensures reliable operation of the electronic circuitry. Alternatively, the indication may be used to reset the electronic (e.g., digital) circuitry, allowing it to begin operation from a known state when the supply voltage is known to have achieved a voltage level sufficient for operation.

A variety of PON circuits capable of performing the supervisory functions outlined above are available. Unfortunately, they are not capable of guaranteeing the validity of the indication of their supervisory operation until the supply voltage has reached at least some minimum voltage level (e.g., approximately 3 volts DC); that is, for a short period of time following application of power to an electronic system, while the supply voltage is building toward its specified voltage level (e.g., 5 volts), the PON circuit is unable to provide a valid reflection of the status of that supply voltage and may, in fact, indicate that a valid operating voltage level exists when, in fact, it does not.

In turn, an erroneous indication of a valid supply voltage, during this initial power-up, could cause a digital system, for example, to attempt operation to write incorrect and indeterminate data to a non-volatile memory. The problem would not be discovered until sometime later, manifesting itself in, perhaps, a system failure when the indeterminate data is attempted to be used.

There have been attempts to add to commercially available PON circuits external guard circuits that couple the indication of the supply voltage to the operating electronic circuitry, inhibiting it until the supply voltage reaches a level at which the PON circuit can provide a valid reflection of the supply voltage. However, such guard circuits have been found to be unreliable.

SUMMARY OF THE INVENTION

Accordingly, the present invention is directed to an external guard circuit that, although operable by itself, is preferably used with a conventional, off-the-shelf, supply voltage monitor to ensure that a valid indication of supply voltage status is reflected, even during the period of time when the supply voltage monitor is not yet able to provide such valid indication.

Broadly, the guard circuit operates, in conjunction with the supply voltage monitor, to block the output of the supply voltage monitor, supplying instead an indication of supply voltage status. When the supply voltage has reached a level at which proper operation of the supply voltage monitor can reliably operate, the guard circuit will convey the supply voltage status reflected by the supply voltage monitor.

In the preferred embodiment of the invention, the guard circuit includes an output transistor that is coupled to communicate an indication of supply voltage status provided by a conventional supply voltage monitor to an output terminal. Initially (i.e., at supply voltage levels below a predetermined level), the output transistor is held in a non-conducting state by a shunt regulator, blocking whatever supply voltage status indicated by the supply voltage monitor, and providing instead an indication that the supply voltage has not reached, or is below, a voltage necessary for valid circuit operation. The shunt regulator is coupled to the supply voltage, and is configured to conduct when the supply voltage reaches a predetermined voltage level that is sufficient for operation of the supply voltage monitor. Conduction of the shunt regulator causes the output transistor to communicate the supply voltage status provided by the supply voltage monitor to the output pin. From that point on, and as long as the supply voltage is above the predetermined voltage level sufficient for operation of the supply voltage monitor, the supply voltage monitor controls the supply voltage status indication that appears at the output terminal.

During the initial stages of a power-up, when the supply voltage has not reached a voltage level at which the conventional supply voltage monitor is capable of providing a valid output indication of supply voltage status, the output transistor is held in a non-conducting state to provide a secondary indication at the output terminal that the supply voltage has not yet reached the predetermined, safe level, regardless of what the conventional supply voltage monitor indicates. When, however, the supply voltage has reached a voltage level at and above which the conventional supply voltage monitor can correctly operate, and give a valid indication of supply voltage status, the shunt regulator conducts. With the shunt regulator in conduction, the secondary indication is controlled by the output of the conventional supply voltage monitor. When the supply voltage reaches the predetermined voltage at which safe operation of other electronic circuitry is ensured, the conventional supply voltage monitor will so indicate, and that indication will be passed to the output terminal of the guard circuit.

Among the advantages achieved by the present invention is that during the initial stages of power up (i.e., when the supply voltage is first applied), the status of the supply voltage is validly reported.

In addition, the guard circuit is configured so that it can be used with appropriate threshold adjustment without a conventional supply voltage monitor to perform the monitoring functions, albeit without the features provided by conventional monitors.

These, and other advantages and features of the present invention, will become apparent to those skilled in the art to which the invention pertains upon reading of the following description of the preferred embodiment, which should be taken in conjunction with the accompanying drawings.

DESCRIPTION OF THE PREFERRED EMBODIMENT

Figure 1:
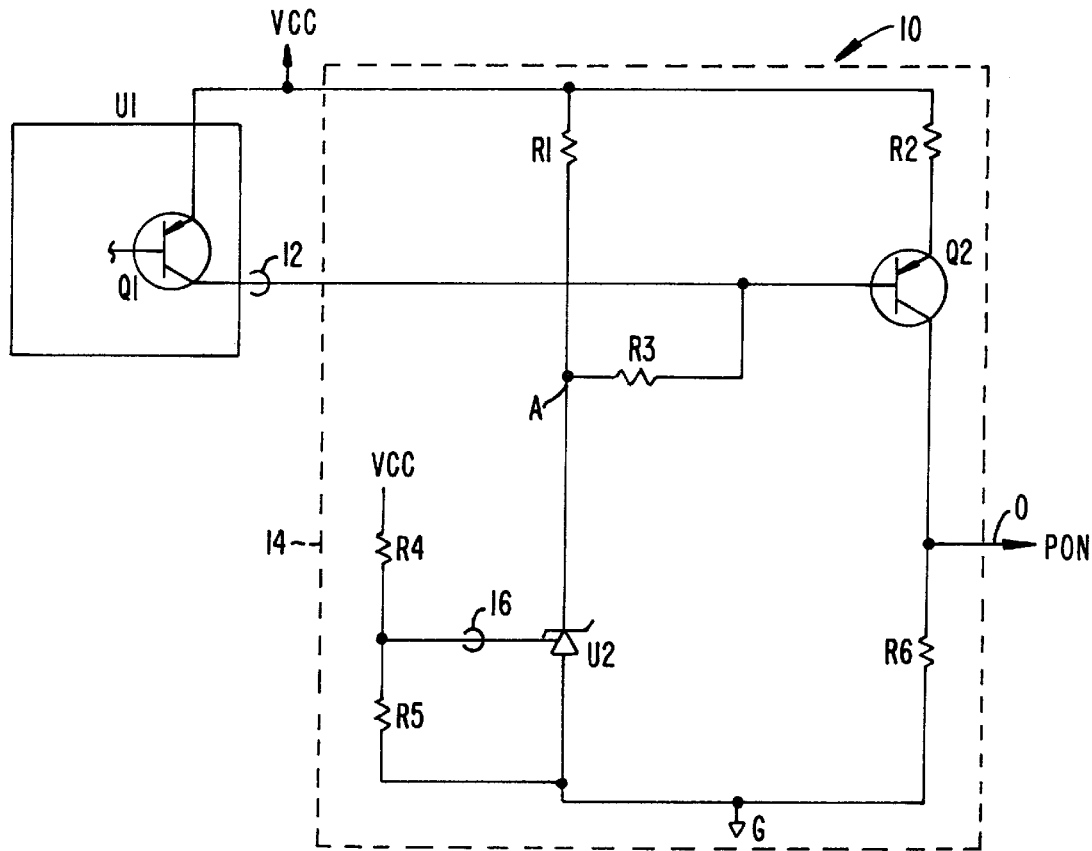
FIG. 1 is a schematic diagram of supply voltage monitor system incorporating present invention.

Turning now to the figures, and for the moment specifically to FIG. 1, designated generally with the reference numeral 10 is a monitor system constructed according to the present invention for monitoring a supply voltage (Vcc). As shown, the monitor system 10 includes a commercially available supply voltage monitor U1 coupled to the supply voltage Vcc. An output terminal 12, connected to an open collector output of a transistor Q1 of the supply voltage monitor, is connected to a base lead of a PNP transistor Q2 that forms a part of a guard circuit 14. The emitter terminal of the transistor Q2 connects to the supply voltage Vcc through resistor R2, and the collector of the transistor Q2 connects to a ground (G) potential through resistor R6. At the junction between the collector of the transistor Q2 and the resistance R6 is an output terminal 0 whereat a power on (PON) signal is presented to indicate the supply voltage has reached and/or exceeded a voltage level deemed a safe operating voltage. As will be seen, the PON signal is a secondary indication of the supply voltage status during the initial stages of power-on. When the supply voltage reaches a voltage level at which the supply voltage monitor U1 is considered to be able to give a valid indication, the PON signal will follow the indication supplied at the output 12.

The output terminal 12, is also connected to one terminal of a resistor R3; the other terminal of the resistor R3 connects to the junction between a resistor R1 and a shunt regulator U2. As can be seen, the resistor R1 and the shunt regulator U2 form a series circuit between the supply voltage Vcc and ground potential G.

The shunt voltage regulator U2 includes a control pin 16 that connects to a voltage divider network consisting of resistors R4 and R5. Resistors R4, R5 form a series path between the supply voltage Vcc and the ground potential G to develop between them a control voltage that is indicative of the supply voltage Vcc.

The supply voltage monitor U1 is an off-the-shelf item that is manufactured by Texas Instruments of Dallas Tex., and sold under the Part No. TL7702. It has two open collector outputs, one as shown in FIG. 1 (i.e., Q1), and the other formed by the collector of an NPN transistor. The present invention is shown using the open collector output of the PNP transistor. The monitor U1 operates to monitor the supply voltage Vcc, turning on the transistor Q1 to allow it to source current when the supply voltage Vcc is below the predetermined voltage level. When the predetermined voltage level is reached by the supply voltage, the transistor Q1 is turned off.

At low levels of supply voltage, however, such as during, for example, the time that the supply voltage is initially applied, the monitor U1 may not be able to correctly reflect the status of the supply voltage Vcc, i.e., it is indeterminate. It is the function, therefore, of the guard circuit 14 to obviate that indeterminacy and ensure a proper reflection of supply voltage status during low levels (e.g., during initial turn-on or power-up) of the supply voltage.

Figure 2:
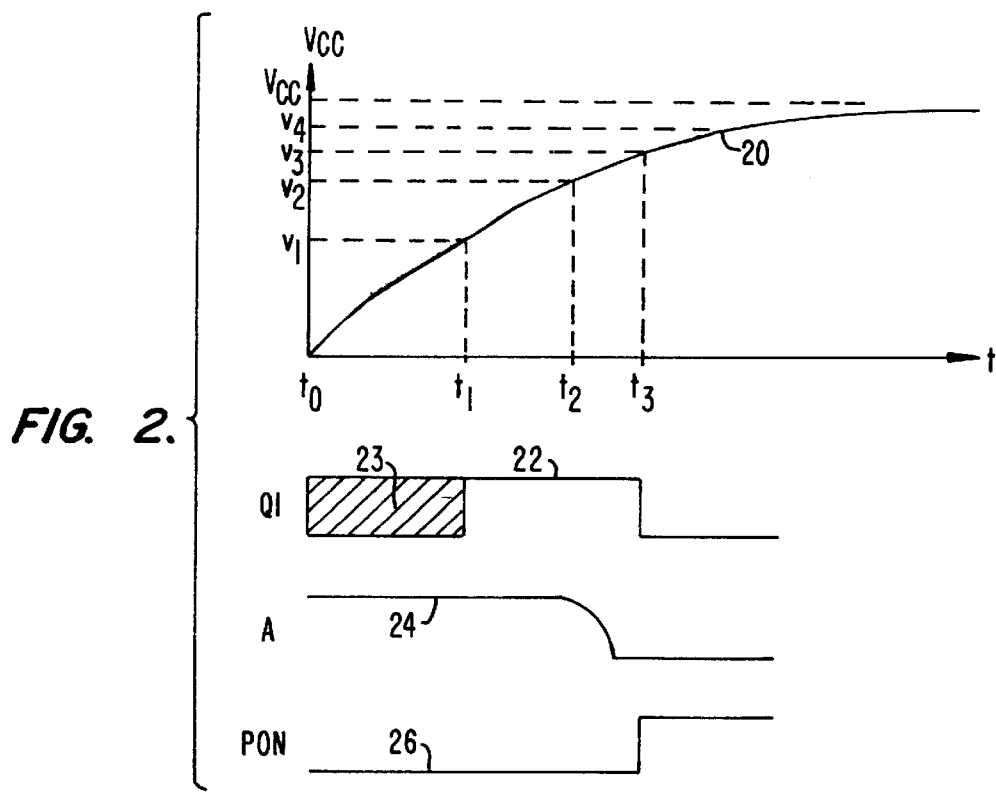
FIG. 2 is a time-voltage diagram, illustrating the operation of the monitor system shown in FIG. 1 as the supply voltage rises from an initial (no voltage) application.

Operation of the monitoring system 10, and in particular the guard circuit 14, will be understood with reference to FIG. 2, in which a waveform 20 portrays the rise of the supply voltage Vcc over time, beginning at an initial time $t_0$ when the supply voltage was essentially zero volts. The waveform 22 depicts the state of the transistor Q1 of the monitor U1, showing that for an initial period of time ($t_0$ to $t_1$) the output 12 from the collector of the transistor Q1 is indeterminate, in the sense that it can be in a conducting or non-conducting state. This indeterminacy is indicated on the waveform 22 by the cross-hatched area 23. However, when, at time $T_1$, the supply voltage Vcc reaches the voltage level $v_1$, output 12 of the monitor U1 can be relied upon, i.e., it now supplies a valid indication of the status of the supply voltage.

The waveform 24 shows the voltage level at node A. When the shunt regulator U2 is not conducting, the voltage level at node A will be pulled up toward supply voltage level. The values of the resistors forming the voltage divider network R4/R5 are selected so that the shunt regulator will not conduct until the supply voltage Vcc reaches and/or exceeds a voltage level $v_2$. Thus, during the time period $t_0-t_1$, and regardless of the conduction state of the transistor Q1 of the monitor U1, since there is no current path to the ground potential at the base of the transistor Q2, the base will be pulled up toward the supply voltage Vcc, and the transistor Q2 will be in non-conduction. The collector of the transistor Q2 will, therefore, be pulled toward the ground potential G, and the PON output signal will be in a non-asserted state as illustrated by the waveform 26.

When, at time $t_1$, the supply voltage Vcc has reached a first voltage level $V_1$, the monitor U1 (validly) turns on the transistor Q1 to that it can source current. The monitor U1 can now validly control the transistor Q2. However, the level of the supply voltage is still below that needed to place the shunt regulator in conduction. Thus, the transistor Q2 remains cut-off for lack of a current path.

At time $T_2$ the supply voltage Vcc reaches a voltage level $V_2$, and the shunt regulator conducts. The voltage at node A (waveform 24) will drop toward the ground potential, and the base of the transistor Q2 now has a current path to the ground potential—through the shunt regulator U2. However, the open collector output of the monitor U1, being set to trip at a higher voltage level ($v_3$) will continue to source current, keeping the transistor Q2 from conducting because of the increased voltage drop across R3.

At time $t_3$, when the supply voltage Vcc reaches a voltage level of $v_3$, the device U1 (which has been programmed to trip at the $v_3$ level) will turn off the transistor Q1. The shunt regulator U2 alone continues to conduct, and pulls the base of the transistor Q2 toward ground, and placing the transistor in conduction. The current through the resistor R6 asserts the PON signal, indicating that the supply voltage has now reached and/or exceeded the predetermined voltage level (e.g., $v_3$) considered appropriate for other electronic circuit operation.

The foregoing discussion of the operation of the supply voltage monitoring system 10 illustrates two important points of the present invention. First, even when the supply voltage is at a voltage level insufficient for proper operation of an off-the-shelf monitor, the PON signal remains validly un-asserted. Second, two voltage levels must be reached and/or exceeded by the supply voltage before PON is asserted to reflect an in-regulation status of the supply voltage, the voltage level $v_2$ to cause the shunt regulator to conduct, and the voltage level $v_3$ at which the device U1 is programmed to indicate the in-regulation status of the supply voltage.

The shunt regulator U2 is preferably a programmable precision reference, manufactured by Motorola Semiconductor, and sold under the part number TL431. The monitor system 10 was designed to operate to monitor a nominal supply voltage of 5 volts DC. The voltage divider resistor (R4/R5) were selected to cause the shunt regulator to conduct at about 3.8 volts, slightly above the voltage level for which the monitor U1 is guaranteed to provide a valid output. The monitor U1 is programmed to assert an indication of safe supply voltage when the supply voltage level reached or exceeded approximately 4.85 volts. Resistor values are:

| | |
|---|---|
| R1: 10K ohms | R4: 1.07K ohms |
| R2: 470 ohms | R5: 1.58K ohms |
| R3: 1K ohms | R6: 1K ohms |

In summary, there has been disclosed a monitor system 10, including a conventional supply voltage monitor U1 and a guard circuit 14, capable of validly reflecting the status of the out-of-regulation state of a supply voltage at low voltage levels. It will be recognized by those skilled in this art that while the operation of the invention has been described in terms of a rising supply voltage, the invention will perform in the same manner as described for a falling supply voltage. Thus, if after having reached and/or exceeded a valid supply voltage level, and having been indicated as such assertion of the PON signal, the supply voltage drops to a level insufficient for circuit operation, the monitor U1 will turn on the transistor Q1 to cause it to begin sourcing current. This, in turn, will turn off transistor Q2, de-asserting the PON signal to indicate that the supply voltage has dropped below the level considered safe for operation.

What is claimed is:

1. A supervisory system for monitoring a supply voltage and for asserting an output signal indicative of the supply voltage reaching and/or exceeding a predetermined voltage level relative to a reference potential, the supervisory circuit comprising:

transistor means for asserting the output signal, the transistor means including a base lead, a collector lead coupled to the reference potential by a first resistor, and an emitter lead coupled to the supply voltage by a second resistor;

an output terminal coupled to a junction between the collector lead and the first resistor; and a shunt regulator means having a cathode lead coupled to the supply voltage by a third resistor and to the base lead by a fourth resistor, an anode lead coupled to the reference potential, and a control lead coupled to the supply voltage, the shunt regulator means operating to conduct when the supply voltage exceeds a first voltage level that is between the reference potential and the predetermined voltage level.

2. The supervisory system of claim 1, including a voltage divider means coupled between the supply voltage and the reference potential to develop an indication of the supply voltage exceeding the first voltage level, the voltage divider means being coupled to provide the indication to the control lead of the shunt regulator means.

3. The supervisory system of claim 2, wherein the voltage divider means includes fifth and sixth resistors connected in series circuit configuration, the indication of the supply voltage being provided at a junction between the fifth and sixth resistors.

4. A system for supervising a supply voltage to assert a power on signal indicating that the supply voltage exceeds in magnitude a desired voltage value relative to a reference potential, the system including circuit means coupled to receive and monitor the supply voltage, the circuit means including means for providing a current when the supply voltage is less in magnitude than the desired voltage value, the circuit means terminating the current when the supply voltage exceeds the desired voltage value, and further including:

transistor means having a base terminal coupled to receive the current, and a collector terminal coupled to an output; and shunt regulator means coupled between the base terminal and the reference potential to provide a current path between the base terminal and the reference potential when the supply voltage exceeds in magnitude a basic voltage level;

wherein the transistor means asserts the power on signal at the output when the supply voltage exceeds both the basic and the desired voltage levels.

5. The improvement of claim 4, wherein the reference potential is a ground potential.

6. The improvement of claim 5, wherein the supply voltage varies between the ground potential and a positive voltage level.

7. The improvement of claim 4, wherein the transistor means has an emitter terminal coupled to the supply voltage, and including resistance means coupling the collector terminal to the reference potential and said output coupled to the collector terminal whereat the indication is provided.

8. The system of claim 4, wherein the basic voltage level is between the reference potential and the desired voltage level.

9. The system of claim 8, wherein the reference potential is a ground potential.

10. The system of claim 9, wherein the supply voltage is positive.

11. The system of claim 4, wherein the shunt regulator means includes a voltage divider means coupled to the supply voltage to indicate when the magnitude of the supply voltage exceeds the basic voltage level.

12. The system of claim 4, wherein the shunt regulator means includes voltage generating means coupled to the supply voltage for providing an indication of the supply voltage exceeding the basic voltage level, and circuit means coupled to receive the indication and to conduct when the indication is provided.

13. A monitor system coupled to a direct current supply voltage to provide a power on indication at a monitor output that the supply voltage has achieved a desired voltage level relative to an initial voltage level, the system comprising:

supply voltage monitor means coupled to receive and operate from the supply voltage to assert the power on indication when the supply voltage reaches the desired voltage level; and guard circuit means coupling the supply voltage monitor means to the monitor output to receive and communicate the power on indication to the monitor output only when the supply voltage has exceeded a safe voltage level, the safe voltage level being between the initial voltage level and the desired voltage level.

14. The monitor system of claim 13, wherein the initial voltage level is a ground potential.

15. The monitor system of claim 14, wherein the supply voltage is positive.

16. The monitor system of claim 14, wherein the supply voltage is approximately a positive 5 volts.

17. The power on system of claim 15, wherein the guard circuit means includes transistor means having a base terminal coupled to receive the power on indication from the supply voltage monitor means, a shunt regulator coupled to the supply voltage and to the base terminal, and wherein the transistor means operates to conduct to communicate the power on indication to the monitor output when the supply voltage exceeds the safe voltage level to cause the shunt regulator means to form a current path for the base terminal to the ground potential.

18. A monitor system for supervising a supply voltage to provide an power on indication that the supply voltage exceeds a desired voltage value, the system including circuit means couple to receive the supply voltage, the circuit means including first transistor means operating to provide a source of current when the supply voltage is below the desired voltage and to terminate the source of current when the supply voltage exceeds the desired voltage, the improvement comprising:

second transistor means having a base terminal coupled to receive the current provided by the first transistor means, an emitter terminal coupled to the supply voltage, and a collector lead;

resistance means coupling the collector terminal to a ground potential;

an output terminal coupled to the collector terminal of the second transistor, the power on indication being provided at the output terminal; and shunt regulator means coupled to provide a current path from the base terminal to the ground when the supply voltage exceeds a first voltage;

wherein the second transistor means is caused to conduct to provide the power on indication when the supply voltage exceeds both the first and desired voltage.

19. The system of claim 18, wherein the first voltage is less than the desired voltage.

20. The system of claim 19, wherein the shunt regulator means includes a voltage divider circuit couple to the supply voltage to provide the first voltage.

21. The system of claim 20, wherein the shunt regulator means includes means having a control pin coupled to the voltage divider circuit to be placed in a conducting state when the first voltage is provided.

* * * * *